United States Patent [19]

Grant et al.

[11] 4,427,478

[45] Jan. 24, 1984

[54] PROCESS FOR MAKING AN ENCAPSULATED CIRCUIT BOARD AND PRODUCTS MADE THEREBY

[75] Inventors: Barbara D. Grant; Carol R. Jones, both of San Jose, Calif.

[73] Assignee: International Business Machines Corporation, Armonk, N.Y.

[21] Appl. No.: 392,998

[22] Filed: Jun. 28, 1982

[51] Int. Cl.³ .................. B05D 3/06; B21G 7/02; B65D 85/54; F16B 15/08
[52] U.S. Cl. .................. 156/275.5; 156/272.2; 156/273.5; 156/273.3
[58] Field of Search ............... 156/273.3, 273.5, 272.2, 156/275.5, 275.7, 178, 55, 296, 298; 427/53.1, 427/54.1, 96

[56] References Cited

U.S. PATENT DOCUMENTS

| 3,646,572 | 2/1972 | Burr | 174/68.5 |
|---|---|---|---|
| 3,658,620 | 4/1972 | Hall | 156/273.5 |
| 3,674,602 | 7/1972 | Keogh et al. | 156/380 |
| 3,674,914 | 7/1972 | Burr | 174/68.5 |
| 4,018,333 | 4/1977 | Blackwood | 156/275.5 |
| 4,115,185 | 9/1978 | Carlson et al. | 156/634 |
| 4,180,608 | 12/1979 | Del | 428/196 |
| 4,305,854 | 12/1981 | Rowe | 260/24 |
| 4,358,331 | 11/1982 | Schmidt et al. | 156/275.7 |

FOREIGN PATENT DOCUMENTS 130678  10/1979  Japan ............................... 156/273.5

Primary Examiner—Edwards C. Kimlin
Assistant Examiner—Merrell Cashion
Attorney, Agent, or Firm—Henry E. Otto, Jr.

[57] ABSTRACT

A process is described for fabricating an encapsulated circuit board. The process involves use of an adhesive which is photochemically curable to a limited preselected depth so as to rigidly fix the circuit wires in X and Y directions while permitting limited pliability of the adhesive and hence mobility of the wires in the Z direction. The adhesive preferably is one which is also thermally curable so that at a later stage of fabrication (e.g., either as a part of or after lamination of individual circuit boards into a multilayered circuit board), the complete unit may be thermally bulk cured to rigidly fix all wires in the Z direction.

10 Claims, No Drawings

PROCESS FOR MAKING AN ENCAPSULATED CIRCUIT BOARD AND PRODUCTS MADE THEREBY

RELATED PATENT APPLICATIONS ASSIGNED TO SAME ASSIGNEE

Varker, Ser. No. 392,996, filed on even date herewith, entitled "High Density Encapsulated Circuit Board."

Shipley, et al, Ser. No. 392,997, filed on even date herewith, entitled "Encapsulated Wire Circuit Board Including an Improved Adhesive."

BACKGROUND OF INVENTION

This invention relates to a process for making encapsulated circuit boards and products made by said process.

Considerable prior art discloses thermal curing of adhesives used in the manufacture of conventional printed circuit boards (e.g., see U.S. Pat. Nos. 4,115,185 and 4,180,608). Ultraviolet (UV) radiation has also been used to cure the adhesives employed in printed circuit board manufacture (e.g., see U.S. Pat. No. 4,305,854). In the manufacture of conventional printed circuit boards, circuit patterns are created by a sequence of steps involving deposition of photoresist, masking, exposure, etching of unexposed (or exposed) resist, and metal deposition. For multi-layered boards, these steps must be repeated to build up successive layers. As circuit density increases, precise registration of successive layers becomes more critical and control of the processing steps becomes more difficult. This greatly increases the probability of short and open circuits, impairing quality and reliability.

To overcome these and other difficulties, encapsulated circuit boards have been proposed (e.g., see U.S. Pat. Nos. 3,646,572; 3,674,914; and 3,674,602). The typical process employed in their manufacture is to dispose a plurality of insulation-coated wires in preselectable positions in a thermo-setting resin adhesive which is not cured and remains pliable after application. This undesirably enables the wires to shift from their preselected positions and lose critical registration until heat and pressure is applied to fully cure the thermo-setting resin and permanently bond the wires to a substrate.

In the above-referenced related Varker application an improved process for fabricating an encapsulated circuit board is disclosed and claimed. According to his process, a plurality of wires is pressed into an adhesive that is thermally cured to inhibit movement of the wires when so positioned. This application also suggests that, under certain circumstances (e.g., where a large number of wires are to be carried by the board), it may be desirable to rigidly position the wires in the X and Y directions but permit limited mobility perpendicular thereto (i.e., in Z direction) by use of a two-part epoxy adhesive to enable thermal curing of the adhesive everywhere except under the wires. However, such selective curing was found difficult to achieve.

There is a need for a simpler and less expensive process than thermal curing of a two-part epoxy adhesive to achieve dimensional stability of the wires in the X and Y directions, while permitting limited mobility and flexibility of the adhesive (and hence movement of the wires) in the Z direction.

DESCRIPTION OF THE INVENTION

According to the present invention, an encapsulated circuit board is made by depositing on at least one side of a supporting substrate an adhesive that is photochemically curable, disposing a plurality of wires in preselected positions in the adhesive, and exposing the adhesive to light of limited intensity and duration for curing the adhesive to a preselected depth sufficient to maintain the wires registered in X and Y directions on the substrate, while permitting limited pliability of the adhesive and consequent mobility of the wires in the Z direction.

More specifically, a substrate, preferably made of an epoxy-glass laminate, has a photochemically curable adhesive deposited on at least one side thereof. This adhesive is also preferably one which is thermally curable. Materials that exhibit these desirable characteristics of being both photochemically and thermally curable include photosensitive dielectric resin materials, such as of the type disclosed and claimed in U.S. Pat. No. 4,169,732 to J. F. Shipley and assigned to the assignee of the present invention. These resins can be applied either by spray coating from a solvent-based solution or by direct application from a film. The resultant films are of good quality and, even when applied as a film, display excellent adhesion to epoxy-glass substrates.

According to a feature of the invention, after the wires are pressed into the adhesive, the adhesive is cured to only a depth preselected by controlling the intensity and duration of exposure. As a result of this partial cure, the wires have limited mobility in the Z direction but none in the X and Y directions.

Applicants' improved fabrication process provides a number of significant advantages. Photochemical curing is more readily controllable than thermal curing. Photochemical curing enables treatment of a single side of a substrate (or even a selectable portion of a single side of a substrate); whereas it is difficult, if not impossible, to limit thermal curing to less than all of the substrate. Photochemical curing also permits temperature-sensitive components to be incorporated in the circuit board, eliminating the probability of damage that would occur with thermal curing.

Single layer circuit boards fabricated in the above-described manner may be laminated together to form a multi-layered circuit board. Photochemical curing enables this lamination to be successfully accomplished with only a single layer of adhesive because the extent of curing can be adjusted according to either the thickness of the adhesive or degree of photochemical exposure dosage.

When the need for mobility of the adhesive and wires in the Z direction no longer exists, it will generally be desirable to completely cure the adhesive to insure that the wires will be rigidly registered in the Z as well as in the X and Y directions. This may be achieved by exposing the board to additional irradiation in the form of light or heat, sufficient to completely cure the adhesive photochemically or thermally, respectively. This thermal approach is particularly desirable in the case of multi-layered circuit boards because the entire multi-layered board may be thermally cured as a unit, either as a part of or subsequent to the lamination step.

BEST MODE OF CARRYING OUT THE INVENTION

The photosensitive dielectric materials above described in the referenced Shipley patent provided satisfactory results. However, it was subsequently found that improved results were obtained by modifying the patented material in the manner disclosed and claimed in the above-referenced related Shipley et al. application incorporated herein by reference. To meet the best mode requirement, however, the method of preparation and application of the improved adhesive material will now be briefly described.

This improved adhesive was prepared by dissolving equal parts of two epoxy resins (Dow 7858 and Shell Epon 1004) into 1.3 parts cellosolve acetate, then adding 0.33 part acrylic acid and 0.02 part benzyldimethylanime. The mixture was mixed and heated to 60° C. for 24 hours, then cooled. To this mixture 0.26 part trimethylolpropane triacrylate, 0.06 part 2-t-butylanthraquinone, 0.001 part benzoquinone, 3.7 parts phenoxy resin and 0.3 part silica were added. The resultant mixture was then coated onto a polyester film and dried as a film of desired thickness in an oven for a time and at a temperature appropriate for the film thickness desired. After drying, the adhesive film was laminated onto an epoxy-glass panel. The wires were then pressed into the adhesive film.

According to the present invention, the assemblage was irradiated with a UV lamp for 20 minutes to partially cure the film, i.e., only to a desired preselected depth to restrict mobility except in the Z direction; whereupon the assemblage was baked at 70° C. for 2 hours. To form a multi-layered circuit board, a plurality of these partially cured boards were superposed and laminated by thermally completely curing the adhesive. The degree and duration of such cure was sufficient to prevent movement of the wires in all directions.

It will be understood that sensitivity of the adhesive to light may be adjusted by varying the amount of the photosensitizer (such as 2-t-butylanthraquinone) therein. Also, if desired, the adhesive material may be, and serve as, a dielectric insulator.

While the invention has been described with reference to a preferred embodiment thereof, it will be understood by those skilled in the art that the foregoing and other changes in form and detail may be made therein without departing from the spirit, scope and teaching of the invention. Accordingly, the process herein disclosed and the product made thereby are to be considered merely as illustrative and the invention is to be limited only as specified in the claims.

We claim:

1. In a process for making an encapsulated circuit board, the improvement which comprises the steps of:
    depositing on at least one side of a supporting substrate an adhesive which is photochemically curable;
    disposing a plurality of wires in preselected positions in said adhesive; and
    exposing the adhesive to light of limited intensity and duration for curing the adhesive to a preselected depth sufficient to maintain the wires registered in X and Y directions on the substrate, while permitting limited pliability of the adhesive and consequent mobility of the wires in the Z direction.

2. In the process claimed in claim 1, the further step of laminating a plurality of such encapsulated circuit boards together to form a multi-layered structure.

3. In the process claimed in claim 1, the further step, after the need for mobility of the wires in the Z direction no longer exists, of subjecting the board to an irradiation dosage sufficient to completely cure all the adhesive to prevent any movement of the wires.

4. In the process claimed in claim 1, the further step, after the need for mobility of the wires in the Z direction no longer exists, of subjecting the board to heat to complete curing of all the adhesive for rigidly maintaining the wires registered in the Z direction as well as the X and Y directions.

5. In the process claimed in claim 1, adjusting the amount of a photosensitizer in the adhesive as necessary to provide a preselected degree of sensitivity to light.

6. A process for making an encapsulated multi-layered circuit board, characterized by the steps of:
    depositing on at least one side of a supporting substrate an adhesive which is both photochemically and thermally curable;
    disposing a plurality of wires in preselected positions in said adhesive;
    exposing the adhesive to light for curing the adhesive beside but not under the wires for maintaining the wires registered in X and Y directions while permitting limited pliability of the adhesive and consequent mobility of the wires in the Z direction;
    laminating a plurality of such encapsulated circuit boards together to form a multi-layered structure; and
    as a part of or subsequent to the laminating step, subjecting the structure to an irradiation dosage sufficient to completely cure the adhesive for rigidly maintaining the wires registered in the Z direction as well as in the X and Y directions.

* * * * *